United States Patent
Takeda et al.

(10) Patent No.: US 9,892,780 B1
(45) Date of Patent: Feb. 13, 2018

(54) SEMICONDUCTOR MEMORY DEVICE INCLUDING OUTPUT BUFFER

(71) Applicant: MICRON TECHNOLOGY, INC., Boise, ID (US)

(72) Inventors: Hiromasa Takeda, Tokyo (JP); Hiroki Fujisawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/729,345

(22) Filed: Oct. 10, 2017

Related U.S. Application Data

(63) Continuation of application No. 15/460,206, filed on Mar. 15, 2017, which is a continuation of application No. 14/622,520, filed on Feb. 13, 2015, now Pat. No. 9,627,013.

(30) Foreign Application Priority Data

Feb. 17, 2014 (JP) .................................. 2014-027370

(51) Int. Cl.
  *G11C 7/10* (2006.01)
  *G11C 11/4093* (2006.01)
  *G11C 11/4094* (2006.01)
  *G11C 11/4074* (2006.01)

(52) U.S. Cl.
  CPC ...... *G11C 11/4093* (2013.01); *G11C 11/4074* (2013.01); *G11C 11/4094* (2013.01); *G11C 7/1051* (2013.01)

(58) Field of Classification Search
  CPC ............ G11C 11/4093; G11C 11/4074; G11C 11/4094
  See application file for complete search history.

(56) References Cited

U.S. PATENT DOCUMENTS

| | | | |
|---|---|---|---|
| 6,351,169 B2 | 2/2002 | Kuge | |
| 2010/0207680 A1 | 8/2010 | Kuwahara et al. | |
| 2011/0062984 A1 | 3/2011 | Kuwahara et al. | |
| 2011/0248742 A1* | 10/2011 | Osanai ............... | H03K 19/0005 326/30 |
| 2013/0088257 A1* | 4/2013 | Hara ................ | H03K 19/00315 326/30 |
| 2015/0063041 A1* | 3/2015 | Arai ..................... | G11C 7/1057 365/189.05 |

FOREIGN PATENT DOCUMENTS

JP  2008-048361  2/2008

* cited by examiner

*Primary Examiner* — Uyen B Tran
(74) *Attorney, Agent, or Firm* — Dorsey & Whitney LLP

(57) ABSTRACT

An apparatus includes a first terminal configured to communicate data with an outside of the apparatus, a second terminal configured to receive a first power source potential, a third terminal configured to receive a second power source potential lower than the first power source potential, a fourth terminal configured to be coupled to a calibration resistor, an output buffer including first to third nodes coupled to the first to third terminals respectively, and a replica circuit including fourth and fifth nodes coupled to the second and third terminals respectively, and sixth node coupled to the fourth terminal.

20 Claims, 15 Drawing Sheets

US 9,892,780 B1

SEMICONDUCTOR MEMORY DEVICE INCLUDING OUTPUT BUFFER

CROSS-REFERENCE TO RELATED APPLICATIONS

This application is a continuation of U.S. patent application Ser. No. 15/460,206, filed Mar. 15, 2017, which is a continuation of U.S. patent application Ser. No. 14/622,520, filed on Feb. 13, 2015, issued as U.S. Pat. No. 9,627,013 on Apr. 18, 2017, which is based upon and claims the filing benefit of priority from Japanese Patent Application No. 2014-27370 filed On Feb. 17, 2014, These applications and patent are incorporated herein in their entirely and for all purposes.

FIELD OF THE INVENTION

The present invention relates to semiconductor devices, and in particular, to a semiconductor device including an output buffer.

DESCRIPTION OF PRIOR ART

A semiconductor device such as a DRAM (Dynanic Random Access Memory) is provided with a plurality of data input/output terminals for inputting/outputting data stored in memory cells. Each of the plurality of data input/output terminals is provided with an output buffer which outputs the potential corresponding to the data (read data) read from the memory cell.

The output buffer is provided with a preliminary circuit, which outputs control signals corresponding to read data, and an output circuit, which outputs either one of a power source potential VDDQ and a ground potential VSSQ to the corresponding data input/output terminal in accordance with the control signals. The output circuit is provided with a pull-up circuit, which outputs the power source potential VDDQ, and a pull-down circuit, which outputs the ground potential VSSQ. The pull-up circuit includes a plurality of p-channel-type transistors each having a first end supplied with the power soave potential VDDQ and a second end connected to the corresponding data input/output terminal. On the other hand, the pull-down circuit includes a plurality of n-channel-type transistors each having a first end supplied with the ground potential VSSQ and a second end connected to the corresponding data input/output terminal.

Each of the pull-up circuit and the pull-down circuit has impedance which is caused by the on resistance of the transistors. It is preferred that the impedance always be equal to a prescribed value (in a case of DRAM, normally 240Ω) of the impedance of the output buffer from the viewpoint of realizing high-speed output of read data. However, real impedance is varied by changes in the surrounding temperature and variations in the power source potential. The impedance can be adjusted by adjusting the numbers of the transistors of the pull-up circuit and the pull-down circuit which are turned on when read data is output.

Japanese Patent Application Laid-Open No. 2008-048361 shows as an example that the number of the transistors which are actually turned on when read data is output is determined by a calibration operation carried out by a calibration circuit.

DETAILED DESCRIPTION OF THE EMBODIMENTS

Figure 1:
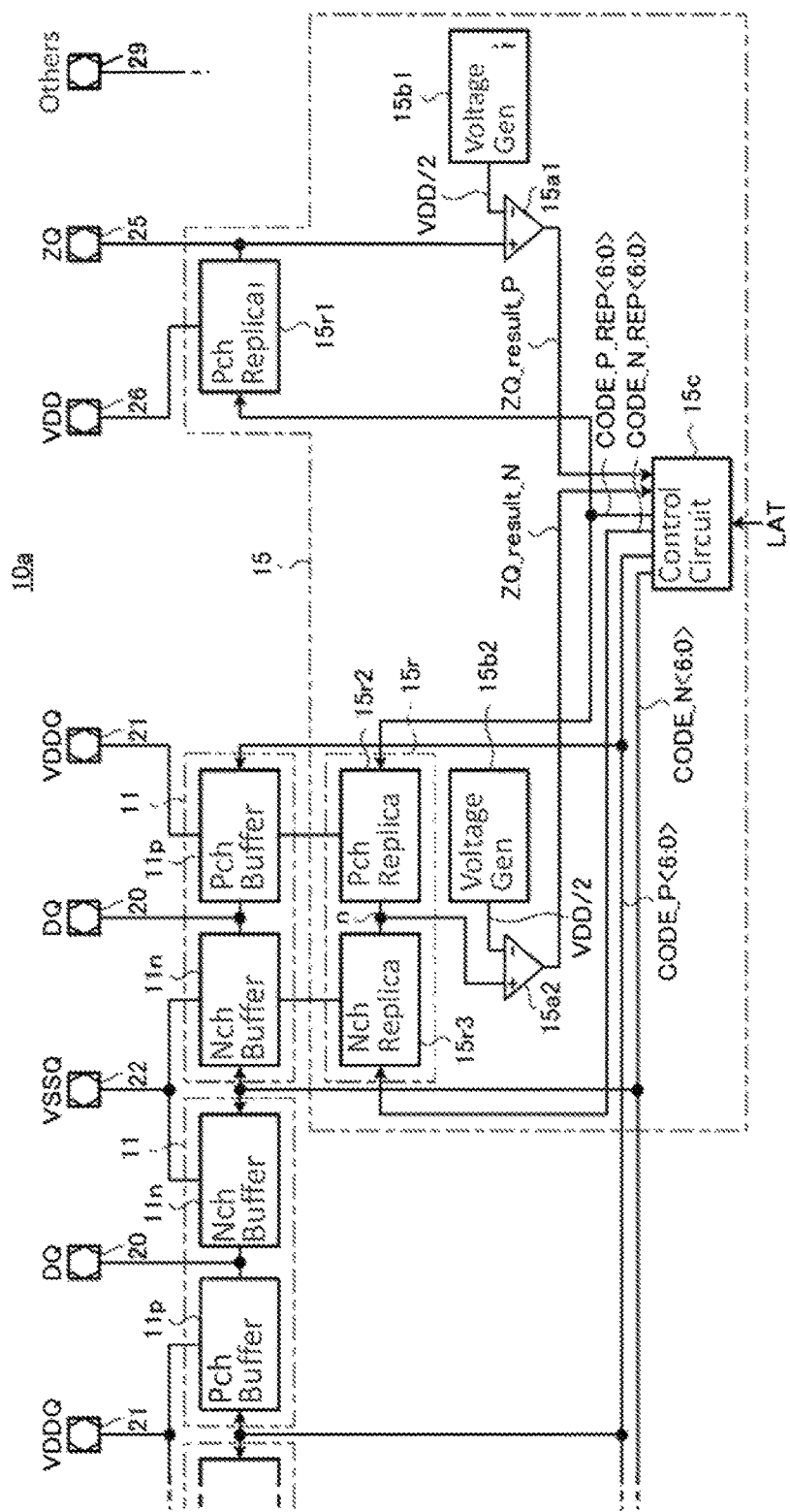
FIG. 1 is a block diagam showing a configuration of a semiconductor device according to a preferred first embodiment of the present invention.

A calibration circuit has a replica output circuit, which is a replica of an output circuit, and a first replica circuit, which is separate from the replica output circuit. The first replica circuit is a replica of a pull-up circuit. An end (hereinafter, referred to as "first node") of the replica output circuit corresponding to a terminal of the output circuit connected to a data input/output terminal only mutually connects a replica of a pull-up circuit (hereinafter, referred to as "second replica circuit") and a replica of a pull-down circuit (hereinafter, referred to as "third replica circuit"). The first node of the replica output circuit is not connected to an external terminal. On the other hand, an end of the first replica circuit that corresponds to a terminal of the pull-up circuit connected to the data input/output terminal is connected to a calibration terminal. The calibration terminal is a terminal that is connected to a calibration resistance having a resistance value equal to the above described prescribed value.

The calibration circuit further has a potential generating circuit, which generates a potential VDD/2 half of a power source potential VDD; a first comparator, which compares the potential VDD/2 and the potential of the calibration terminal; and a second comparator, which compares the potential VDD/2 and the potential of the first node. The calibration circuit further has a control circuit which controls on/off of a plurality of transistors included in the first replica circuit and the replica output circuit so that the potentials of the calibration terminal and the first node become equal to the potential VDD/2 while referencing outputs of the first and second comparators.

If a command directing execution of calibration is supplied from outside, first, the control circuit references the output of the first comparator and controls on/off of the plurality of transistors included in the first replica circuit so that the potential of the calibration terminal becomes equal to the potential VDD/2. In this process, also for the plurality of transistors included in the second replica circuit, the control circuit carries out the on/off control which is the same as that for the transistors in the first replica circuit. As a result, the impedance of each of the first and second replica circuits becomes equal to the above described prescribed value.

Subsequently, the control circuit references the output of the second comparator and controls on/off of the plurality of transistors included in the third replica circuit so that the potential of the first node becomes equal to the potential VDD/2. At this point, the impedance of the second replica circuit has become equal to the above described prescribed value as described above; therefore, the impedance of the third replica circuit also becomes equal to the above described prescribed value by this control.

In the above described manner, the control circuit controls the on/off state of each of the transistors so that the impedance of each of the pull-up circuit and the pull-down circuit becomes equal to the above described prescribed value. Then, the results thereof are reflected to the transistors in the output circuit. As a result, impedance of each of the pull-up circuit and the pull-down circuit are equalized to the above described prescribed value.

Meanwhile, a lower surface of a package constituting a semiconductor device includes a pad row consisting of a plurality of pads arranged and disposed in a row and further includes a plurality of solder balls arranged and disposed in a plurality of rows in both sides of the pad row.

The pads constitute external terminals of the semiconductor device, respectively, and are connected to corresponding solder balls by printed wiring formed on the surface of the package.

Specific examples of the pads include: a DQ pad constituting the data input/output terminal, a ZQ pad constituting the calibration terminal, a VDDQ pad for receiving supply of a power source potential VDDQ, a VDD pad for receiving supply of a power source potential VDD, which is the same potential as the power source potential VDDQ but is provided by a system different from that of the power source potential VDDQ, a VSSQ pad for receiving supply of a ground potential VSSQ, and a VSS pad for receiving supply of a ground potential VSS, which is the same potential as the ground potential VSSQ but is provided by a system different from that of the ground potential VSSQ.

As long as there is no particular problem or the like in terms of layout, the DQ pad is disposed at a position between the VDDQ pad for supplying the power source potential VDDQ to the corresponding pull-up circuit and the VSSQ pad for supplying the ground potential VSSQ to the corresponding pull-down circuit. Such a layout is employed for stabilizing the potential of the data input/output terminal in the case of output of read data by equalizing the power source resistance of an output buffer (parasitic resistance connected to the power source terminal) and reducing the resistance.

Herein, as with the DQ pad, the ZQ pad is disposed at a position between the VDD pad for supplying the power source potential VDD to the first and second replica circuits and the VDD pad for supplying the ground potential VSS to the third replica circuit. As a result, the configurations of the first replica circuit and the replica output circuit including power source resistance are similar to the configurations of the pull-up circuit and the output circuit, respectively, and calibration performance can be improved.

However, disposing the ZQ pad at the position between the VDD pad and the VSS pad in this manner means that a pad of a different type cannot be disposed next to the ZQ pad, and this leads to reduction in the degree of freedom in pad layout. Therefore, techniques that can improve the degree of freedom in pad layout while avoiding reduction in the calibration performance are required.

Hereinafter, preferred embodiments of the present invention will be explained in detail with reference to accompanying drawings.

<First Embodiment>

FIG. 1 shows a configuration of a semiconductor device 10a. As shown in FIG. 1, the semiconductor device 10a is provided with: a plurality of output buffers 11 each having a Pch buffer 11p and an Nch buffer 11n, a calibration circuit 15, a plurality of data input/output terminals 20, a plurality of power source terminals 21 which receive a plurality of high potentials for data, a plurality of power source terminals 22 which receive a plurality of low potentials for data, at least one calibration terminal 25, at least one power source terminal 26 which receives a high potential, and at least another external terminal 29.

The semiconductor device 10a is, for example, a DDR3 SDRAM (Double-Data-Rate 3 Synchronous Dynamic Random Access Memory) or a DDR4 SDRAM (Double-Data-Rate 4 Synchronous Dynamic Random Access Memory) and is provided with a memory cell array, a column-system control circuit, a row-system control circuit, a command decoder, an address input circuit, a clock generating circuit, etc., which are not shown in the drawing but are required for a DDR3 SDRAM or a DDR4 SDRAM.

The data input/output terminals 20, the power source terminals 21, the power source terminals 22, the calibration terminal(s) 25, the power source terminals) 26, and the external terminals) 29 have pad shapes, respectively, and are arranged and diposed in one row on a lower surface of a package constituting the semiconductor device 10a as exemplified later in FIG. 8. Therefore, a pad row (terminal row) consisting of the plurality of pads arranged in one row is formed on the lower surface of the package (see later-described FIG. 8).

The data input/output terminal 20 is a terminal (DQ pad) for inputting/outputting data, which is stored in the memory cell array. Regarding output of data (read data), the single output buffer 11 is connected to each of the data input/output terminals 20.

The output buffer 11 is a circuit, which accesses the corresponding data input/output terminal 20 by the Pch buffer 11p and the Nch buffer 11n, and supplies a potential level, to which read data has been reflected, to the corresponding data input/output terminal 20. FIG. 1 does not show read data. FIG. 1 also does not show a circuit relevant to input of data (write data).

The power source terminal 21 is a terminal (VDDQ pad) for receiving supply of a power source terminal VDDQ from outside. The power source terminal 22 is a terminal (VSSQ pad) for receiving supply of a ground potential VSSQ from outside.

As shown in FIG. 1, the data input/output terminal 20 is disposed so as to be adjacent to both of the power source terminal 21 and the power source terminal 22 in the terminal row. To the Pch buffer 11p conesponding to a certain data input/output terminal 20, the power source potential VDDQ is supplied via the power source terminal 21, which is adjacent to the data input/output terminal 20. Similarly, to the Nch buffer 11n corresponding to a certain data input/output terminal 20, the around potential VSSQ is supplied via the power source terminal 22, which is adjacent to the data input/output terminal 20.

Figure 2:
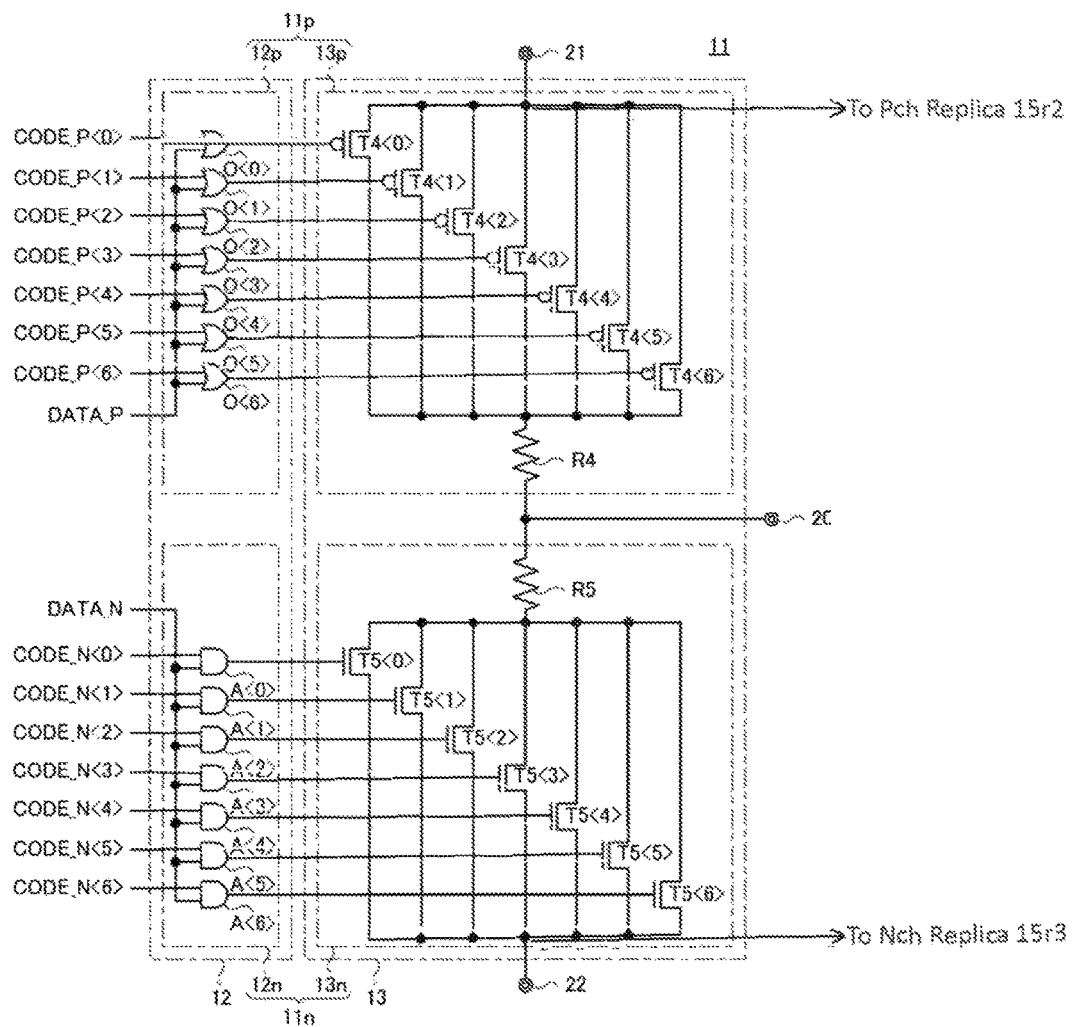
FIG. 2 shows a drawing showing internal configurations of a Pch output buffer and an NC output buffer shown in FIG. 1.

FIG. 2 shows an internal configuration of the output buffer 11 shown in FIG. 1.

As shown in FIG. 2, the output buffer 11 is provided with a preliminary circuit 12, which outputs control signals corresponding to read data, and an output circuit 13, which outputs either one of the power source potential VDDQ and the ground potential VSSQ to the corresponding data input/output terminal 20 in accordance with the control signals.

The output circuit 13 is provided with a pull-up circuit 13p, which is connected between the power some terminal 21 and the data input/output terminal 20, and a pull-down circuit 13n, which is connected between the power source terminal 22 and the data input/output terminal 20. The preliminary circuit 12 is provided with a preliminary circuit 12p, which consists of Pch transistors corresponding to the pull-up circuit 13p, and a preliminary circuit 12n, which consists of Nch transistors corresponding to the pull-down circuit 13n. As shown in FIG. 2, the above-described Pch buffer 11p is provided with the preliminary circuit 12p and the pull-up circuit 13p. Similarly, the Nch buffer 11n is provided with the preliminary circuit 12n and the pull-down circuit 13n.

As shown in FIG. 2, the pull-up circuit 13p has a plurality of p-channel-type transistors T4 <6:0>, which are connected in parallel between the power source terminal 21 and the data input/output terminal 20, and, a resistance dement R4, which is connected between these plurality of transistors T4 <6:0 > and the data input/output terminal 20. In the present specification, when the end of a reference sign is denoted with a symbol of <m:n>, it area that the number of the constituents thereof is m−n+1 from <n>-th to <m>-th.

It is preferred that the W/L ratios (gate-width/gate-length ratios) of the plurality of transistors T4 <6:0> be set to be mutually different. Specifically, it is preferred that the transistors T4 <6:0> be formed so that the W/L ratio of the transistor T4 <k>(k is an integer, of 0 to 6) is "$2^k$" in a relative value. As a result, the impedance of the pull-up circuit 13p can be finely adjusted in a wide range. In this case, the number of transistors T4 is 7, but is only required to be at least plural from the viewpoint of adjusting the impedance. This point also applies to later-described transistors T5 <6:0>.

It is preferred that the resistance value of the resistance element R4 be the value that is half of a prescribed value (normally 240Ω) of the impedance of the output buffer, in other words, be 120Ω. This point also applies to the resistance value of a later-described resistance element R5.

The preliminary circuit 12p includes OR circuits O <6:0>, the number of which is the same as that of the transistors T4 <6:0>. A gate electrode of the transistor T4 is connected to an output terminal of the OR circuit O <k>.

Control signals CODE_P <6:0> and a selection signal DATA_P are supplied to the preliminary circuit 12p. The control signals CODE_P <6:0> are supplied from the calibration circuit 15 shown in FIG. 1 and are the signals for selecting part of or all of the transistors T4 <6:0>, and details thereof will be described later. The potential of each of the control signals CODE_P <6:0> is controlled to a high level or a low level by a later-described control circuit 15c. On the other hand, the selection signal DATA_P is a signal which is output by an unshown output control circuit based on the contents of read data. The potential of the selection signal DATA_P is low level if the read data is at a high level and is a high level if the read data is at a low level.

The control signal CODE_P <k> and the selection signal DATA_P are supplied to the OR circuit O <k>. Therefore, the logical-disjunction signal of the control signal CODE_P <k> and the selection signal DATA_P is supplied to the gate electrode of the transistor T4 <k>. The transistor T4<k>, which has received that, becomes a connected state if both of the control signal CODE_P <k> and the selection signal DATA_P are at a low level and becomes a disconnected state in other cases. If any one of the transistors T4 <6:0> becomes the connected state, the data inputoutput terminal 20 is connected to the power source terminal 21 via the pull-up circuit 13p, and, therefore, a high level is output from the data input/output terminal.

The impedance of the output buffer 11 in this case is expressed by the impedance of the pull-up circuit 13p. The impedance of the pull-up circuit 13p is expressed by the combined resistance of the on resistance of the transistors which are in the connected state among the transistors T4 <6:0> and the resistance value of the resistance element R4. Therefore, in the semiconductor device 10a, the impedance of the output buffer 11 in the case of high-level output can be controlled by controlling the potential levels of the control signals CODE_P <6:0>. Although details will be described later, the control circuit 15c shown in FIG. 1 is set so as to output the control signals CODE_P <6:0> with which the impedance of the pull-up circuit 13p becomes the above described prescribed value (for example, 240Ω) as a result of a later-described calibration operation. By virtue of this, in the semiconductor device 10a, the impedance of the output buffer 11 in the case of high-level output is maintained at the above described prescribed value.

As shown in FIG. 2, the pull-down circuit 13n includes the plurality of n-channel-type transistors T5 <6:0>, which are connected in parallel between the power source terminal 22 and the data input/output terminal 20, and the resistance element R5, which is connected between the plurality of transistors T5 <6:0> and the data input/output terminal 20.

It is preferred that the W/L ratios of the plurality of transistors T5 <6:0> be set to be mutually different. Specifically, it is preferred that the transistors T5 <6:0> be formed so that the W/L ratio of the transistor T5 <k> is "$2^k$" in a relative value. As a result, the impedance of the pull-down circuit 13n can be also finely adjusted in a wide range like the pull-up circuit 13p.

The preliminary circuit 12n includes AND circuits A <6:0>, the number of which is the same as that of the transistors T5 <6:0>. A gate electrode of the transistor T5 <k> is connected to an output terminal of the AND circuit A <k>.

Control signals CODE_N <6:0> and a selection signal DATA_N are supplied to the preliminary circuit 12n. The control signals CODE_N <6:0> are supplied from the calibration circuit 15 shown in FIG. 1 and are signals for selecting part of or all of the transistors T5 <6:0>, and the details thereof will be described later. The potential of each of the control signals CODE_N <6:0> is controlled to a high level or a low level by the later-described control circuit 15c. On the other hand, the selection signal DATA_N is a signal which is output from an unshown output control circuit based on the contents of read data. As with the selection signal DATA_P, the potential of the selection signal DATA_N is at a low level if the read data is at a high level and is at a high level if the read data is at a low level.

The control signal CODE_N <k> and the selection signal DATA_N are supplied to the AND circuit A <k>. Therefore, a logical-conjunction signal of the control signal CODE_N <k> and the selection signal DATA_N is supplied to the gate elect ie of the transistor T5 <k>. The transistor T5 <k>, which has received that, becomes a connected state if both of the control signal CODE_N <k> and the selection signal DATA_N are at a high level and becomes a disconnected state in other cases. If any one of the transistors T5 <6:0> is in a connected state, the data input/output terminal 20 is connected to the power source terminal 22 via the pull-down circuit 13n, and, therefore, the data input/output terminal 20 outputs a low level.

The impedance of the output buffer 11 in this case is expressed by the impedance of the pull-down circuit 13n. The impedance of the pull-down circuit 13n is expressed by the combined resistance of the on resistance of the transistors which are in the connected state among the transistors T5 <6:0> and the resistance value of the resistance element R5. Therefore, in the semiconductor device 10a, the impedance of the output buffer 11 in the case of low-level output can be controlled by controlling the potential levels of the control signals CODE_N <6:0>. Although details will be described later, the control circuit 15c shown in FIG. 1 is set so as to output the control signals CODE_N <6:0> with which the impedance of the pull-down circuit 13n becomes the above described prescribed value (for example, 240Ω) as a result of a later-described calibration operation. By virtue of this, in the semiconductor device 10a, the impedance of the output buffer 11 in the case of low-level output is maintained at the above described prescribed value.

FIG. 1 will be described again. The calibration terminal 25 is a terminal (ZQ pad) to which a calibration resistance ZQR (see FIG. 3) is connected. The calibration resistance ZQR is a resistance having a resistance value equal to the prescribed value (for example, 240Ω) of the impedance of the output buffer 11 and is connected when the calibration circuit 15 carries out a later-described calibration operation.

The power source terminal 26 is a terminal (VDD pad) for receiving supply of a power source potential VDD from outside. The power source potential VDD is a potential at the same level as the power source potential VDDQ, which is supplied to the power source terminal 21. The reason why the potentials at the same level are separately supplied is to prevent occurrence of interference between them and to cause the power source potential VDD and the power source potential VDDQ to be different from each other in the future. As shown in FIG. 1, the power source terminal 26 is disposed adjacent to the calibration terminal 25 in the terminal row.

Although not shown in FIG. 1, the semiconductor device 10a is also provided with a power source terminal (a later-described power source terminal (VSS pad) 27 shown in FIG. 14) for receiving supply of a ground potential VSS from outside. The ground potential VSS is a potential at the same level as the ground potential VSSQ, which is supplied to the power source terminal 22. These are also separately supplied for the reasons similar to those of the power source potential VDD and the power source potential VDDQ.

In a conventional semiconductor device, the calibration terminal 25 has been disposed in a terminal row so as to be adjacent not only to the power source terminal 26, but also to the power source terminal 27. On the other hand, in the semiconductor device 10a, as shown in FIG. 1, instead of the power source terminal 27, the external terminal 29, which is different from that, is disposed adjacent to the calibration terminal 25. This embodiment can be realized such a layout of external terminals (pads) while avoiding reduction in calibration performance.

The calibration circuit 15 is connected to the calibration terminal 25 and the power source terminal 26. Hereinafter, the configuration and operations of the calibration circuit 15 will be explained in detail with reference also to FIG. 3 to FIG. 6.

As shown in FIG. 1, the calibration circuit 15 has a Pch replica circuit 15r1, a replica output circuit 15r, comparators 15a1 and 15a2, potential generating circuits 15b1 and 15b2, and the control circuit 15c.

Figure 3:
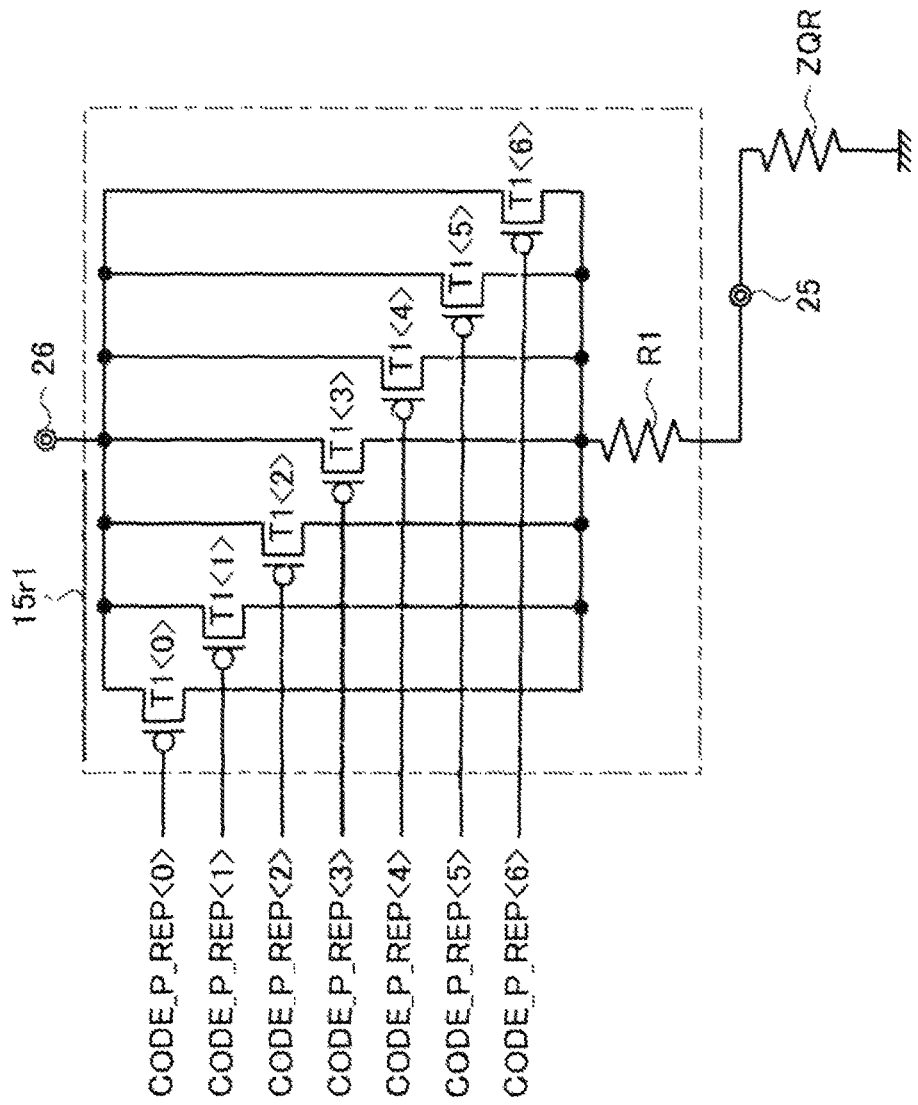
FIG. 3 shows an internal configuration of a Pch replica circuit shown in FIG. 1.

FIG. 3 shows the internal configuration of the Pch replica circuit 15r1 shown in FIG. 1. The Pch replica circuit 15r1 is a replica of the pull-up circuit 13p shown in FIG. 2. Note that "replica" referred to in the present invention means a circuit that has an internal circuit configuration identical to a target circuit. As shown in FIG. 3, as with the pull-up circuit 13p, the Pch replica circuit 15r1 includes a plurality of p-channel-type transistors T1 <6:0>, which are connected in parallel between the power source terminal 26 and the calibration terminal 25, and a resistance element R1, which is connected between the pluarlity of transistors T1 <6:0> and the data input output terminal 20. The uansistor T1 <k> is formed so as to have the same W/L ratio as the transistor T4 <k>. The resistance element R1 is formed so as to have the same resistance value that that of the resistance element R4. Control signals CODE_P_REP <6:0> from the control circuit 15c are supplied to gate electrodes of the transistors T1 <6:0>, respectively.

Figure 4:
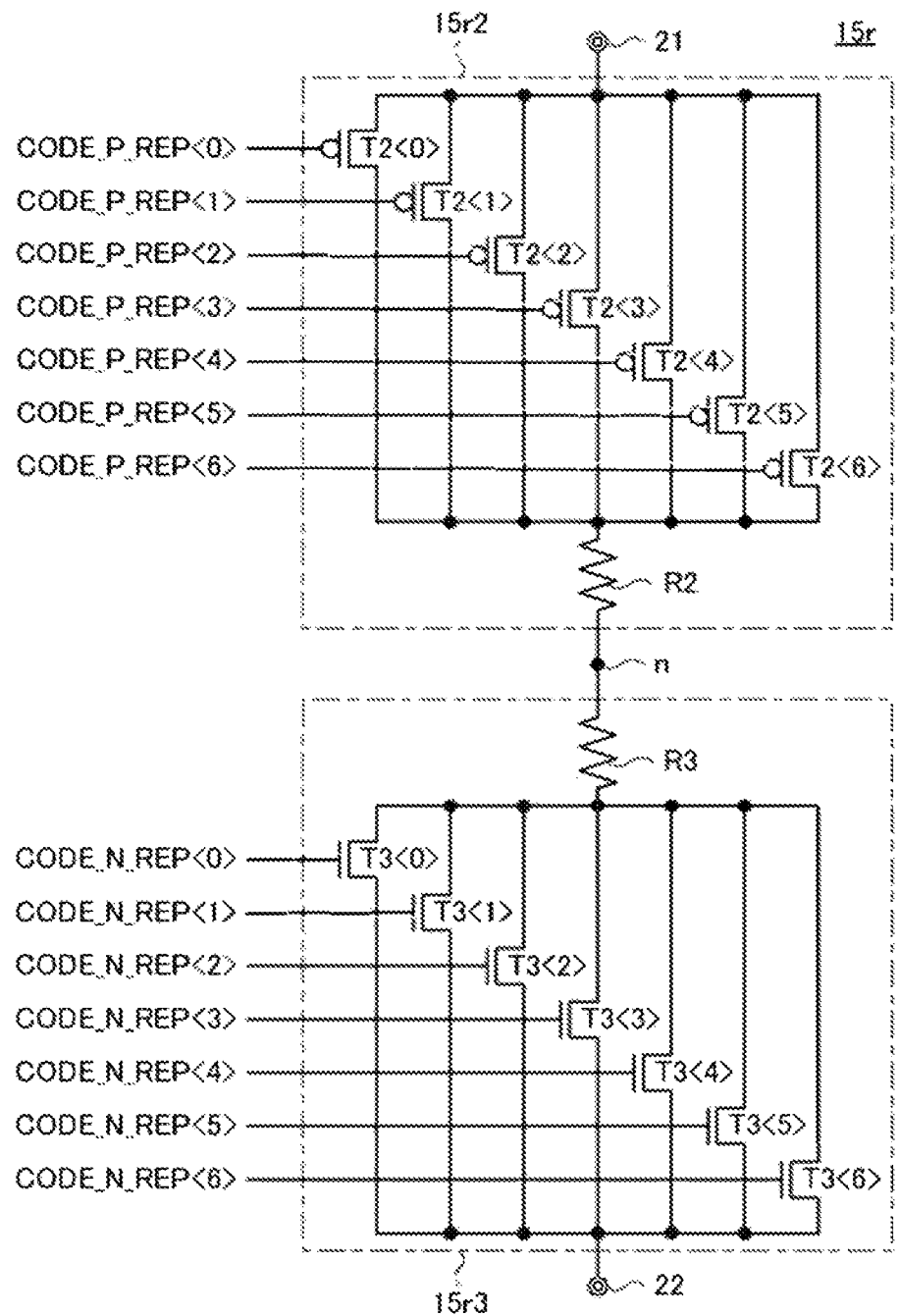
FIG. 4 is a drawing showing internal configurations of a Pch replica circuit and an Nch replica circuit shown in FIG. 1.

FIG. 4 shows internal configurations of a Pch replica circuit 15r2 and an Nch replica circuit 15r3 shown in FIG. 1. The replica output circuit 15r is a replica of the output circuit 13 shown in FIG. 2. As shown in FIG. 4, the replica output circuit 15r has a configuration in which the Pch replica circuit 15r2, which is a replica of the pull-up circuit 13p shown in FIG. 2, and the Nch replica circuit 15r3, which is a replica of the pull-down circuit 13n shown in FIG. 2, are connected to each other by a node n. The node n corresponds to an end of the output circuit 13 connected to the data input/output terminal 20, but is not connected to an external terminal.

As shown in FIG. 4, as with the pull-up circuit 13p, the Pch replica circuit 15r2 includes a plurality of p-channel-type transistors T2 <6:0>, which are connected in parallel between the power source terminal 21 and the node n, and a resistance element R2, which is connected between the plurality of transistors T2 <6:0> and the node n. The transistor T2 <k> is formed so as to have the same W/L ratio as that of the transistor T4 <k>. The resistance element R2 fomred so as to have the same resistance value as the resistance element R4. The control signals CODE_P_REP <6:0> are supplied from the control circuit 15c to gate electrodes of the transistors T2 <6:0>, respectively.

As shown in FIG. 4, as with the pull-down circuit 13n, the Nch replica circuit 15r3 includes a plurality of n-channel-type transistors T3 <6:0>, which are connected in parallel between the power source terminal 22 and the node n, and a resistance element R3, which is connected between the plurality of transistors T3 <6:0> and the node n. The transistor T3 <k> is formed so as to have the same W/L ratio as that of the transistor T5 <k>. The resistance element R3 is formed so as to have the same resistance value as that of the resistance element R5. Control signals Code_N_REP <6:0> are supplied from the control circuit 15c to gate electrodes of the transistors T3 <6:0>, respectively.

Each of the potential generating circuits 15b1 and 15b2 shown in FIG. 1 generates a potential VDD/2 which is ½ of the power source potential VDD (=the power source potential VDDQ), for example, by resistance dividing.

The comparator 15a1 shown in FIG. 1 compares the potential of the calibration teminal 25 and the potential VDD/2, which is generated by the potential generating circuit 15b1, and supplies the result thereof to the control circuit 15c as a resultant signal ZQ_result_P. The comparator 15a2 compares the potential of the node n and the potential VDD/2, which is generated by the potential generating circuit 15b2, and supplies the result thereof to the control circuit 15c as a resultant signal ZQ_result_N. The potential VDD/2 may be configured to be supplied from the same potential generating circuit to the comparators 15a1 and 15a2. The control circuit 15c shown in FIG. 1 receives outputs of the comparators 15a1 and 15a2.

Figure 5:
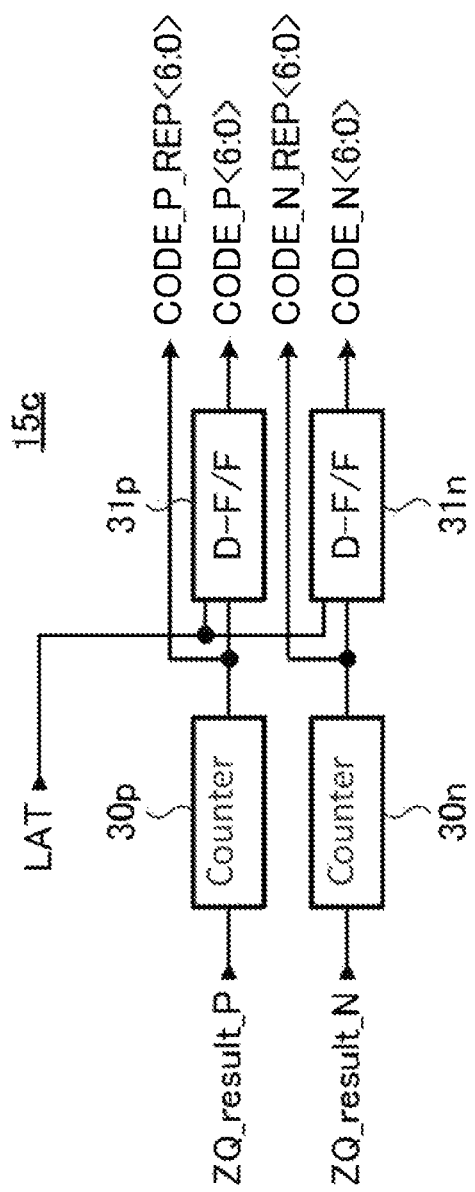
FIG. 5 is a drawing showing an internal configuration of a control circuit shown in FIG. 1.

FIG. 5 shows an internal configuration of the control circuit 15c shown in FIG. 1. The control circuit 15c adjusts the potential levels of the control signals CODE_P_REP <6:0> and CODE_N_REP <6:0> so that each of the potentials of the calibration terminal 25 and the node n becomes equal to the potential VDD/2 by referencing the resultant signals ZQ_result_P and ZQ_result_N. Furthermore, after this adjustment is completed, the control circuit 15c controls the impedance of the output buffer 11 by reflecting the potential levels of the control signals CODE_P_REP <6:0> and CODE_N_REP <6:0> to the potential levels of the control signals CODE_P <6:0> and CODE_N <6:0>, respectively. Thus, the control circuit 15c is a circuit that carries out the calibration operation.

In a detailed explanation, as shown in FIG. 5, the control circuit 15c has counters 30p and 30n and D-type flip-flop circuits 31p and 31n. The counter 30p receives the resultant signal ZQ_result_P and generates the control signals CODE_P_REP <6:0>. The counter 30n receives the resultant signal ZQ_result_N and generates the control signals CODE_N_P <6:0>. Each of the D-type flip-flop circuits 31p and 31n is configured so as to latch the control singals CODE_P_REP <6:0> or CODE_N_REP <6:0> at the activation timing when a latch signal LAT is activated by an unshown control circuit in response to completion of generation of the control signals CODE_N_REP <6:0>. The output signals of the D-type flip-flop circuits 31p and 31n are the control signals CODE_P <6:0> and CODE_N <6:0>. Therefore, the contents of the control signals CODE_P <6:0> and CODE_N <6:0> are switched to the contents of the latest control signals CODE_P_REP <6:0> and CODE_N_REP <6:0> at the timing when the latch signal LAT is activated.

In addition to that, although it is not illustrated, when a command (calibration command ZQCS shown in FIG. 6) directing execution of calibration is supplied fom outside, the control circuit 15c activates the counters 30p and 30n.

Figure 6:
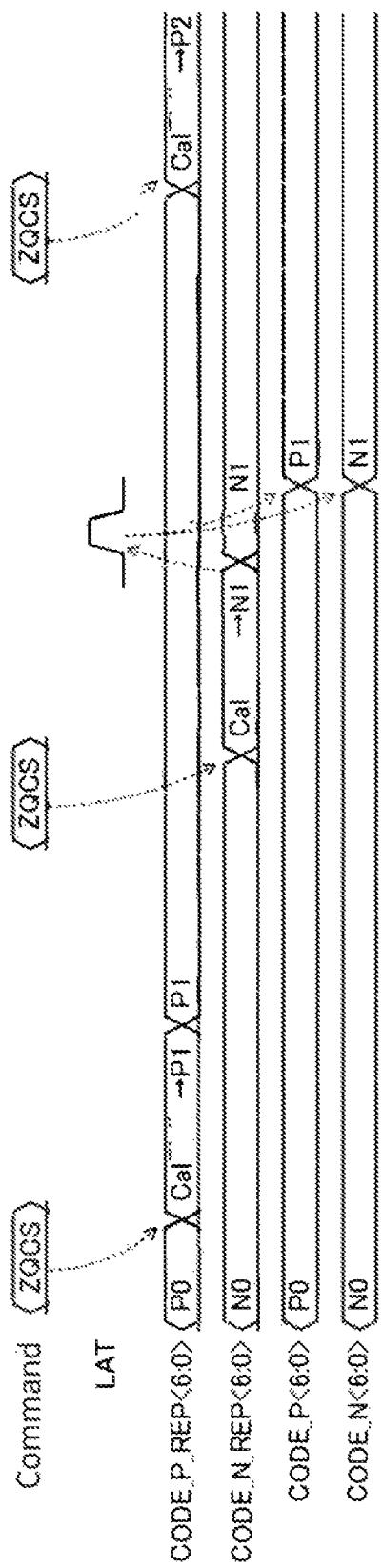
FIG. 6 is a timing chart of signals related to the semiconductor device shown in FIG. 1.

FIG. 6 shows a timing chart showing operation of the control circuit 15c. In the initial state of FIG. 6, the contents of both of the control signals CODE_P_REP <6:0> and CODE_P <6:0> are "P0", and the contents of both of the control signals CODE_N_REP <6:0> and CODE_N <6:0> are "N0".

Then, the calibration command ZQCS is supplied. When the semiconductor device 10a starts the calibration operation, an external controller supplies the calibration command ZQCS to the semiconductor device 10a in a state in which the calibration resistance ZQR is connected to the calibration terminal 25.

When the calibration command ZQCS is supplied, the control circuit 15c activates the counter 30p. While the counter 30p is activated, every time an active edge of an unshowy clock signal arrives, the counter 30p increments or decrements in accordance with the resultant signal ZQ_result_P. In a detailed explanation, the counter 3Op references the resultant signal ZQ_result_P at the timing when the active edge of the clock signal arrives. Then, if the referenced resultant signal ZQ_result_P shows that, for example, the potential of the calibration terminal 25 is higher than the potential VDD/2 (in this case, the impedance of the Pch replica, circuit 15r1 has a value smaller than the resistance value of the calibration resistance ZQR), the counter 30p decrements. On the other hand, if the referenced resultant signal ZQ_result_P shows that the potential of the calibration terminal 25 is lower than the potential VDD/2 (in this case, the impedance of the Pch replica circuit 15r1 has a value larger than the resistance value of the calibration resistance ZQR), the counter 30p increments. The result of this decrement or increment is reflected to the contents of the control signals CODE_P_REP <6:0> and are therefore also reflected to the impedance of the Pch replica circuit 15r1. The count control of the counter 30p finally ends when the potential of the calibration terminal 25 is the closest to the potential VDD/2. The state in which the potential of the calibration terminal 25 is the closest to the potential VDD/2 means the state in which the impedance of the Pch replica circuit 15r1 is the closest to the resistance value of the calibration resistance ZQR. Therefore, as a result of the above described process of the counter 30p, the control signals CODE_P_REP <6:0> which can cause the impedance of the Pch replica circuit 15r1 to be the closest to the resistance value of the calibration resistance ZQR is obtained.

Then, when the potential of the calibration terminal 25 is the closest to the potential VDD/2, the signals CODE_P_REP <6:0> (in FIG. 6, "P1") are obtained. After the contents of the control signals CODE_P_REP <6:0> end, the control ciicuit 15c deactivates the counter 30p again. Thereafter, the contents of the control signals CODE_P_REP <6:0> are fixed to "P1", and the impedance of the Pch replica circuits 15r1 and 15r2 is also fixed to a state that it is close to the above described prescribed value as much as possible.

Then, the calibration command ZQCS is supplied. As shown in FIG. 6, after sufficient time has elapsed for ending the contents of the control signals CODE_P_REP <6:0>, the external controller supplies the calibration command ZQCS again to the semiconductor device 10a.

When the calibration command ZQCS is supplied, the control circuit 15c then activates the counter 30n. The counter 30n is configured to carry out increment or decrement in accordance with the resultant signal ZQ_result_N every time an active edge of an unshown clock signal arrives while it is activated. In, a detailed explanation, the counter 30n references the resultant signal ZQ_result_N at the timing when the active edge of the clock signal arrives. Then, if the referenced resultant signal ZQ_result_N shows that, for example, the potential of the node n is higher than the potential VDD/2 (in this case, the impedance of the Nch replica circuit 15r3 is higher than the impedance of the Pch replica circuit 15r2, which is fixed at a value close to the above described prescribed value as much as possible), the counter 30n increments. On the other hand, if the referenced resultant signal ZQ_result_N shows that the potential of the calibration terminal 25 is lower than the potential VDD/2 (in this case, the impedance of the Nch replica circuit 15r3 is smaller than the impedance of the Pch replica circuit 15r2, which is fixed at a value close to the above described prescribed value as much as possible), the counter 30n decrements. The result of this increment or decrement is reflected to the contents of the control signals CODE_N_ Rep <6:0> and is therefore also reflected to the impedance of the Nch replica circuit 15r3. The count control of the counter 30n finally ends when the potential of the node n is the closest to the potential VDD/2. The state in which the potential of the node n is the closest to the potential VDD/2 means a state in which the impedance of the Nch replica circuit 15r3 is the closest to the impedance of the Pch replica circuit 15r2. Therefore, as a result of the above described process of the counter 30n, the control sipals CODE_N_ REP <6:0> which can cause the impedance of the Nch replica circuit 15r3 to be the closest to the resistance value of the calibration resistance ZQR is obtained.

Then, when the potential of the node n shown in FIG. 1 is the closest to the potential VDD/2, the control signals CODE_N_REP <6:0> (in FIG. 6, "N1") are obtained. After the contents of the control signals CODE_N_REP <6:0> end, the control circuit 15c deactivates the counter 30n again. Thereafter, the contents of the control signals CODE_N_REP <6:0> are fixed to "N1", and the impedance of the Nch replica circuit 15r3 is also fixed in a state that it is close to the above described prescribed value as much as possible.

Then, when the control signals COD_N_P <6:0> end, the unshown control circuit provided in the semiconductor device 10a activates the latch signal LAT. When the latch signal LAT is activated, each of the D-type flip-flop circuits 31p and 31n shown in FIG. 5 latches the control signals CODE_P_REP <6:0> or CODE_N_REP <6:0>. Therefore, as shown in FIG. 6, the values of the control signals $CODE_{\_I\ P}$ <6:0> and CODE_N <6:0> are switched to "P1" and "N1", respectively. As a result, the impedance of each of the pull-up circuit 13p and the pull-down circuit 13n is fixed in a state that is close to the above described prescribed value, and the series of calibration operations is finished.

As described above, in the semiconductor device 10a, as shown in FIG. 1, an end of the Pch replica circuit 15r1 corresponding to a terminal of the output buffer 11 the pull-up circuit 13p shown in FIG. 2 connected to the power source terminal 21 is connected to the power source terminal 26 like a conventional case. Furthermore, in the semiconductor device 10a, an end of the replica output circuit 15r corresponding to a terminal of the output buffer 11 the output circuit 13 shown in FIG. 2) connected to the power source terminal 21 is connected to the power source terminal 21. Then, in the semiconductor device 10a, an end of the replica output circuit 15r corresponding to a terminal of the output buffer 11 (the output circuit 13 shown in FIG. 2) connected to the power source terminal 22 is connected to the power source terminal 22. Hereinafter, the reasons and effects of employing such connections will be explained in detail.

In designing of the calibration circuit 15, the configurations of the Pch replica circuit 15r1 and the replica output circuit 15r may be close to the configurations of the pull-up circuit 13p and the output circuit 13, respective, and it also includes causing the distances between the external terminals and the circuits to be close to those of the pull-up circuit 13p and the output circuit 13.

The Pch replica circuit 15r1 is connected to two external terminals, i.e the calibration terminal 25 and the power source terminal for supplying the power source potential VDDQ or a potential equal to that. In the semiconductor device 10a, as shown in FIG. 1, the power source terminal among them is the power source terminal 26, which is disposed adjacent to the calibration terminal 25. As a result, the distances from these two terminals to the Pch replica circuit 15r1 can be close to the distances from the data input/output terminal 20 and the power source terminal 21 to the pull-up circuit 13p, respectively.

On the other hand, the external terminals to which the replica output circuit 15r is connected are the power source terminal for supplying the power source potential VDDQ or a potential equal to that and the power source terminal for supplying a ground potential VSSQ or a potential equal to that. The replica output circuit 15r is not connected to the calibration terminal 25. In a conventional semiconductor device, the power source terminal 26 and the power source terminal 27 are disposed adjacent to the calibration terminal 25 and have been connected to the replica output circuit 15r so that the distances from these two terminals to the replica output circuit 15r are close to the distances from the power source terminal 21 and the power source terminal 22 to the output circuit 13, respectively. However, the replica output circuit 15r is not connected to the calibration terminal 25 as described above; therefore, the replica output circuit 15r is not necessarily required to be disposed in the vicinity of the calibration terminal 25. The present invention is focusing on this point, and, in the semiconductor device 10a, the potentials are configured to be supplied from the power source terminal 21 and the power source terminal 22, which are disposed adjacent to the data input/output terminal 20, to the replica output circuit 15r. As a result, in the semiconductor device 10a, the necessity of disposing the power source terminal 27 at a position adjacent to the calibration terminal 25 is eliminated, and the degree of freedom in pad layout is improved.

As described above, according to the semiconductor device 10a according to the present embodiment, the power source potential VDDQ and the ground potential VSSQ are configured to be supplied from the power source terminal 21 and the power source terminal 22, which are the same as those for the output circuit 13, to the replica output circuit 15r, which is not connected to the calibration terminal 25 and is therefore not particularly required to be disposed in the vicinity of the calibration terminal 25. Therefore, even though the terminal that receives supply of the ground potential VSSQ or a potential equal to that is not disposed at a position adjacent to the calibration terminal 25, the configuration of the replica output circuit 15r including power source resistance can be close to the configuration of the output circuit 13. Thus, according to the present embodiment, even though the terminal that receives supply of the ground potential VSSQ is not disposed at a position adjacent to the calibration terminal 25, reduction in the calibration performance can be prevented. Therefore, the degree of freedom in pad layout can be improved while avoiding reduction in the calibiation performance.

<Second Embodiment>

Figure 7:
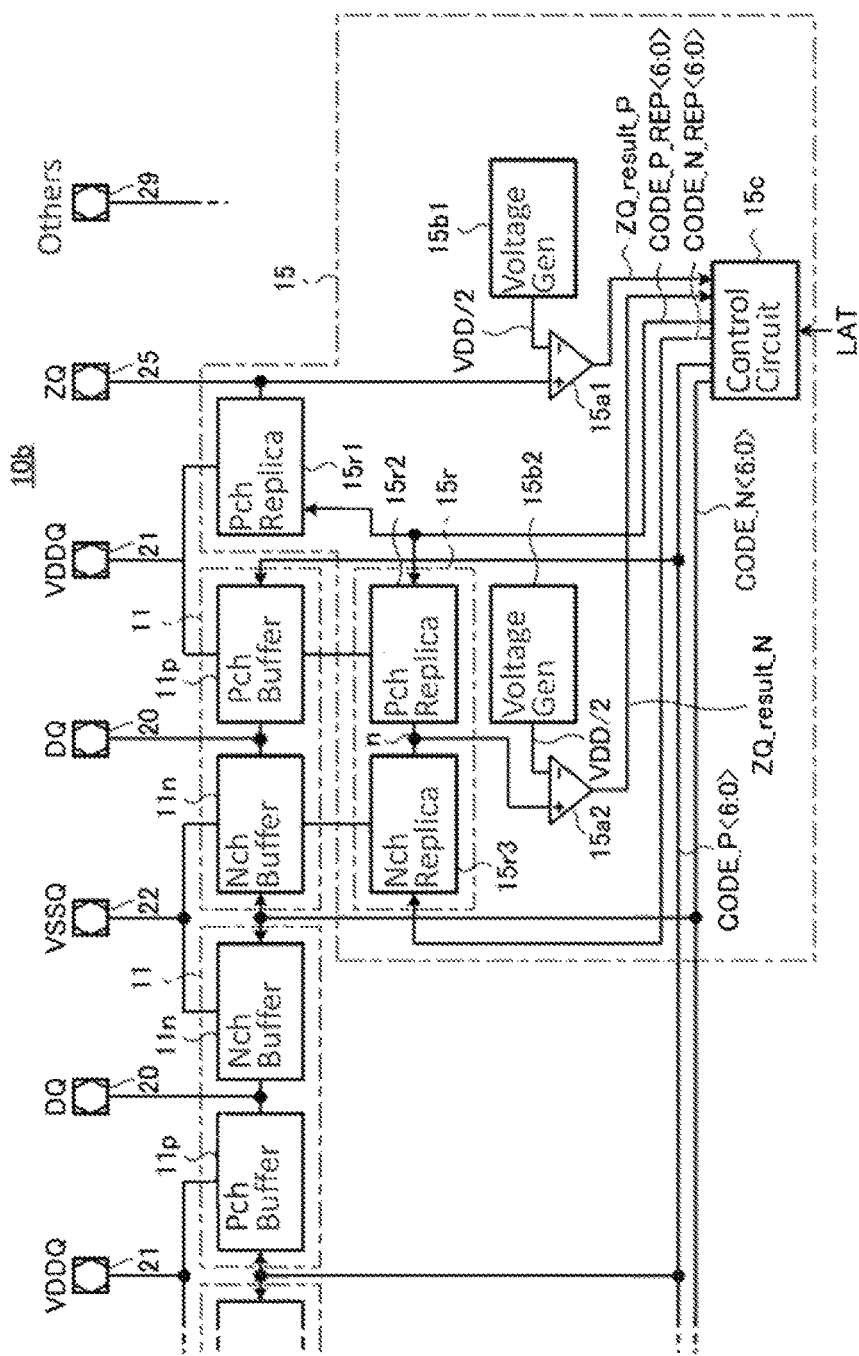
FIG. 7 is a block diagram showing a configuration of a semiconductor device according to a second preferred embodiment of the present invention.

FIG. 7 shows a semiconductor device 10b according to a second embodiment of the present invention. As shown in FIG. 7, the semiconductor device 10b is different from the semiconductor device 10a according to the first embodiment in that the calibration terminal 25 is disposed adjacent to the power source terminal 21, which is disposed adjacent to the data input/output terminal 20, is for data, and is supplied with a high potential and in a point that the end of the Pch replica circuit 15r1 corresponding to a terminal of the pull-up circuit 13p connected to the power source terminal 21 is connected to the power source terminal 21. The other points are similar to the semiconductor device 10a. Therefore, similar components are denoted with the same reference signs, explanations thereof are omitted, and different points will be focused on and explained below.

As shown in FIG. 7, in the semiconductor device 10b, the calibration terminal 25 is disposed adjacent to the power source terminal 21, which is disposed adjacent to the data input/output terminal 20, and the power source potential VDDQ is supplied from the power source terminal 21 to a Pch replica circuit 15r1. Therefore, the distances from the Pch replica circuit 15r1 to the two terminals (the calibration terminal 25 and the power source terminal 21) to which the Pch replica circuit 15r1 is connected are close to the distances from the data input/output terminal 20 and the power source terminal 21 to the pull-up circuit 13p, respectively. The configuration about the replica output circuit 15r in the semiconductor device 10b is the same as that of the semiconductor device 10a. Therefore, according to the semiconductor device 10b according to the present embodiment, as with the semiconductor device 10a according to the first embodiment, the degree of freedom in pad layout can be improved while avoiding reduction in calibration performance.

Figure 8:
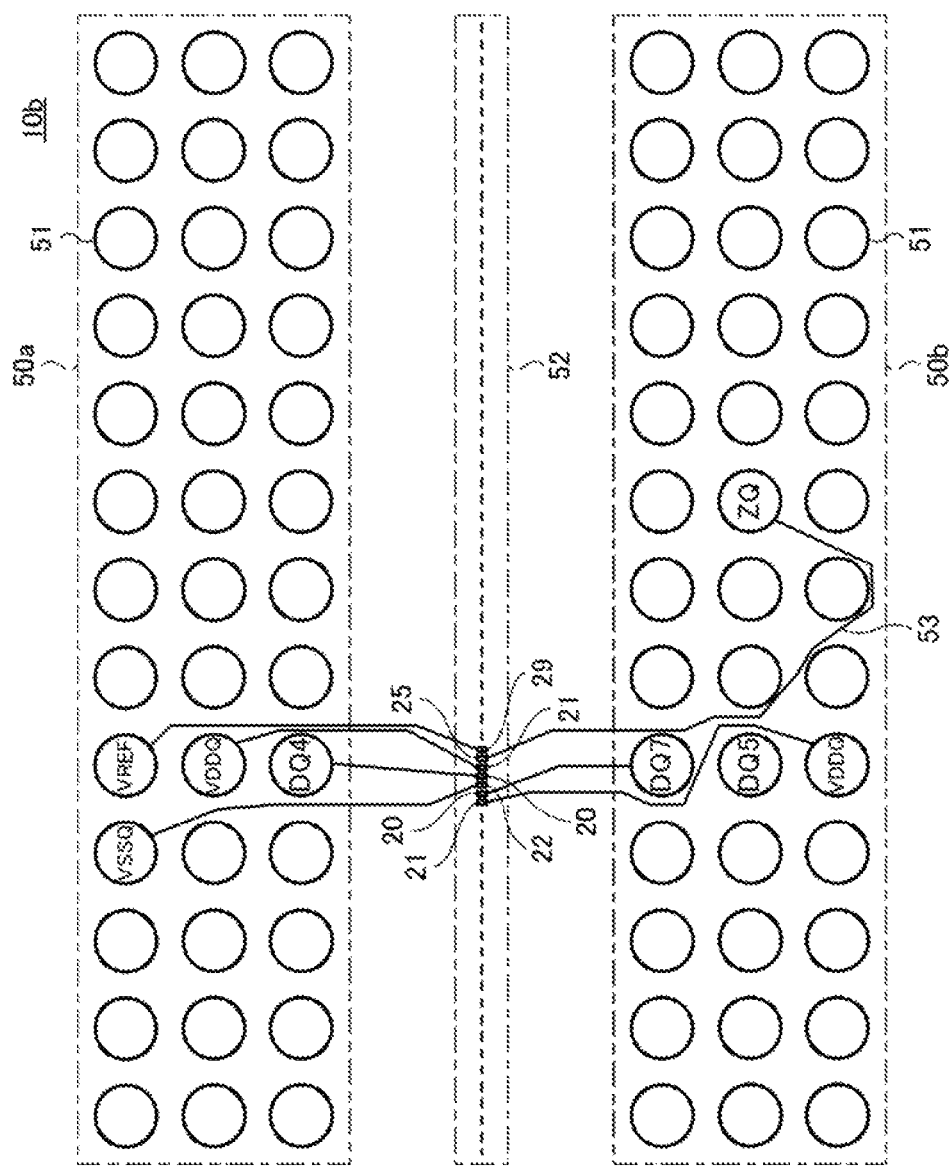
FIG. 8 is a schematic drawing showing a state of a package surface of the semiconductor device 10b shown in FIG. 7.

FIG. 8 shows a state of a package surface of the semiconductor device 10b shown in FIG. 7. Herein, the circumstances that enable the calibration teminal 25 to be disposed adjacent to the power source terminal 21, which is disposed adjacent to the data input/output terminal 20, in the semiconductor device 10b will be explained with reference to FIG. 8.

As shown in FIG. 8, solder-hall areas 50a and 50b for disposing a plurality of solder balls 51 and a pad-row area 52 for disposing a pad row are disposed on a surface of a package constituting the semiconductor device 10b. The solder-ball areas 50a and 50b and the pad-row area 52 are extended in mutually the same direction (transverse direction in the drawing), and the solder-ball areas 50a and 50b are disposed so as to sandwich the pad-row area 52. A pad row consisting of a plurality of pads and corresponding to one row is disposed in the pad-row area 52. The plurality of pads constituting the pad row include the above described power source terminal 21, the power source terminal 22 which is for data and is supplied with the low potential, the calibration terminal 25, the power source terminal 26 which is supplied with the high potential, and the external terminal 29. On the other hand, rows of the solder balls 51 corresponding to three rows are disposed in each of the solder-ball areas 50a and 50b. Each of the solder balls 51 is corresponding to any of the pads as shown in the drawing and is connected to the corresponding pad by wiring 53.

As shown as an example in FIG. 8, the solder ball corresponding to the calibration terminal 25 is disposed at a position somewhat distant from the group of the solder balls corresponding to the data input/output terminals 20. Such a layout of the solder balls is determined by the relationship with the electrodes on a substrate on which the semiconductor device is mounted. Therefore, the layout cannot be freely changed in the side of the semiconductor device. Therefore, in order to dispose the calibration terminal 25 near the data input/output terminal 20 in the pad row as shown in FIG. 7, the wiring length of the wiring 53 may be increased as shown in FIG. 8.

In the semiconductor device 10b, as also shown in FIG. 8, such long wiring can be laid. As a result, the calibration terminal 25 can be disposed adjacent to the power source terminal 21, which is disposed adjacent to the data input/output terminal 20. On the other hand, in the semiconductor device 10a according to the first embodiment, the long wiring 53 connecting the solder ball corresponding to the calibration terminal 25 cannot be laid due to the relationship with other wiring. As a result, in the semiconductor device 10a, the calibration terminal 25 may be disposed at the position away from the data input/output terminal 20 as shown in FIG. 1, and the calibration terminal 25 may not be disposed adjacent to the power source terminal 21, which is disposed adjacent to the data input/output terminal 20.

Figure 9:
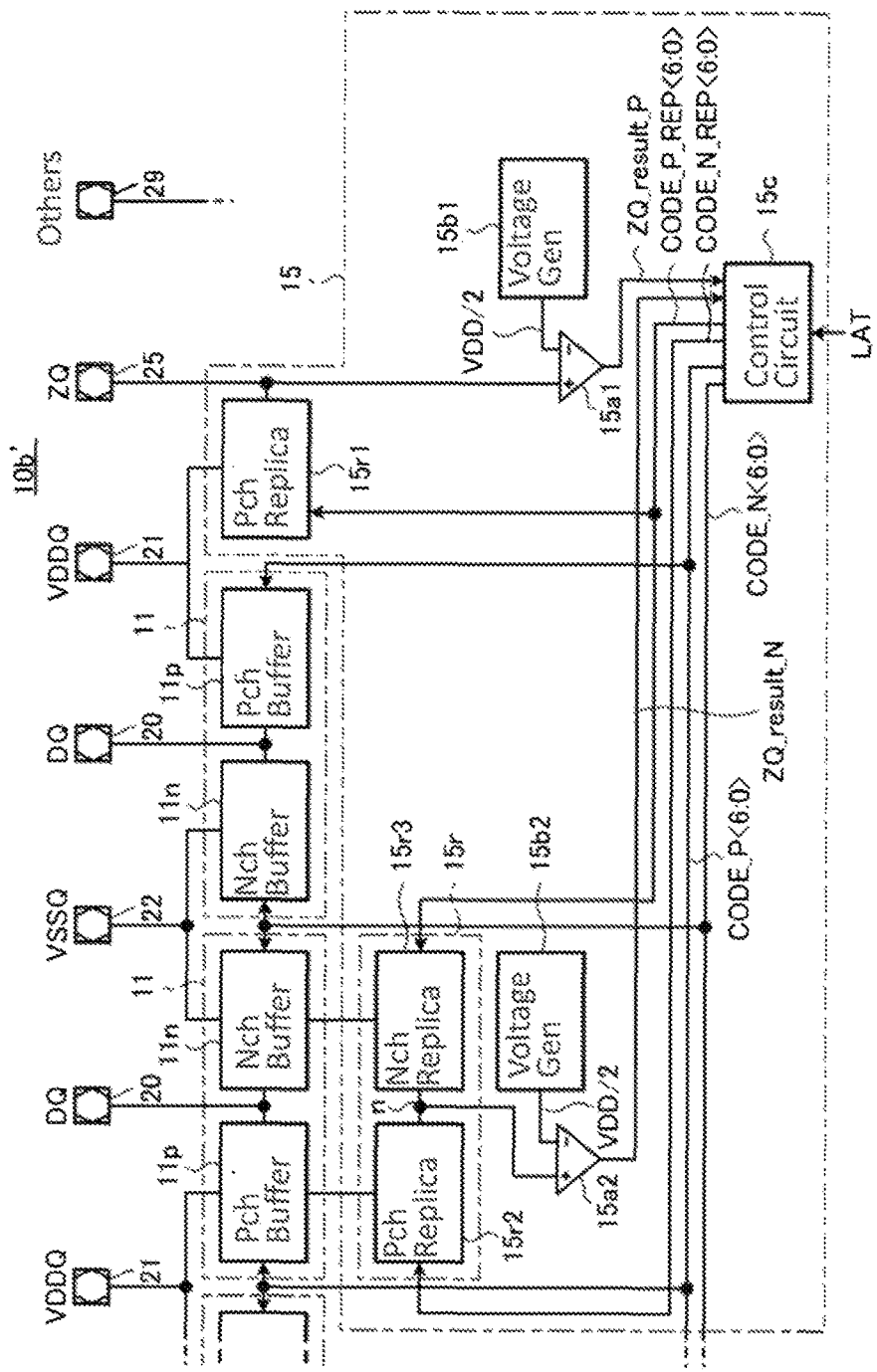
FIG. 9 is a block diagram showing a configuration of a semiconductor device according to a modification example of the preferred second embodiment.

FIG. 9 shows a configuration of a semiconductor device 10b' according to a modification example of the second embodiment of the present invention. In the example of FIG. 7, the replica output circuit 15r is disposed in the vicinity of the data input/output terminal 20, which is the closest to the calibration terminal 25, and receives supply of the power source potential VDDQ and the ground potential VDDQ via the power source terminal 21 and the power source terminal 22, which are disposed adjacent to the data input/output terminal 20. However, such a configuration is not essential. For example, like the semiconductor device 10b' shown in FIG. 9, the replica output circuit 15r may be disposed in the vicinity of the data input/output terminal 20 which is not the data input/output terminal 20 that is the closest to the calibration terminal 25, and the power source potential VDDQ and the ground potential VDDQ may be supplied to the replica output circuit 15r via the power source terminal 21 and the power source terminal 22, which are adjacent to the data input/output terminal 20. Even in this case, the degree of freedom in pad layout can be improved while avoiding reduction in the calibration performance according to this embodiment as with the semiconductor device 10b shown in FIG. 7.

<Third Embodiment>

Figure 10:
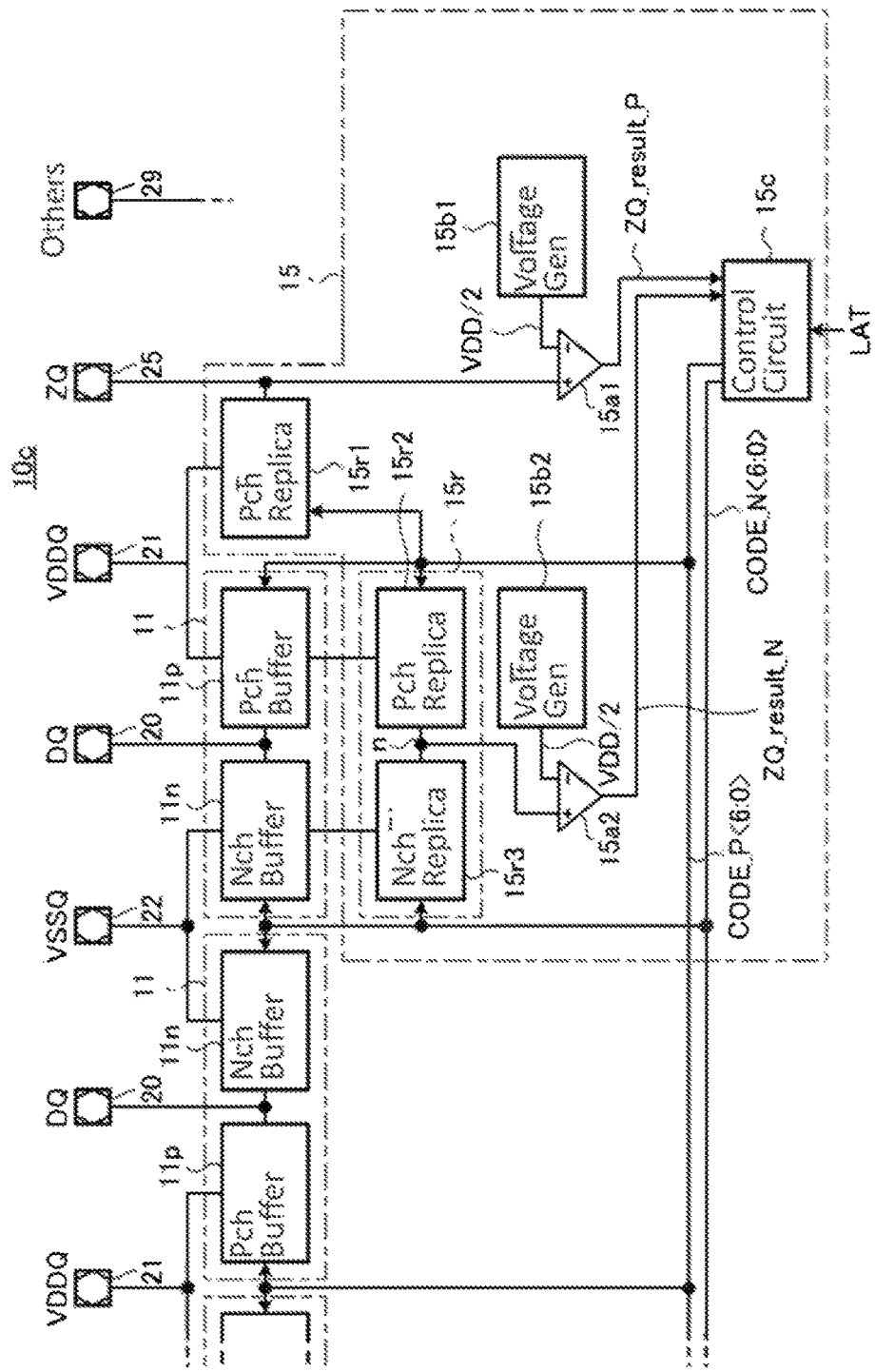
FIG. 10 is a block diagram showing a configuration of a semiconductor device according to a preferred third embodiment of the present invention.
Figure 11:
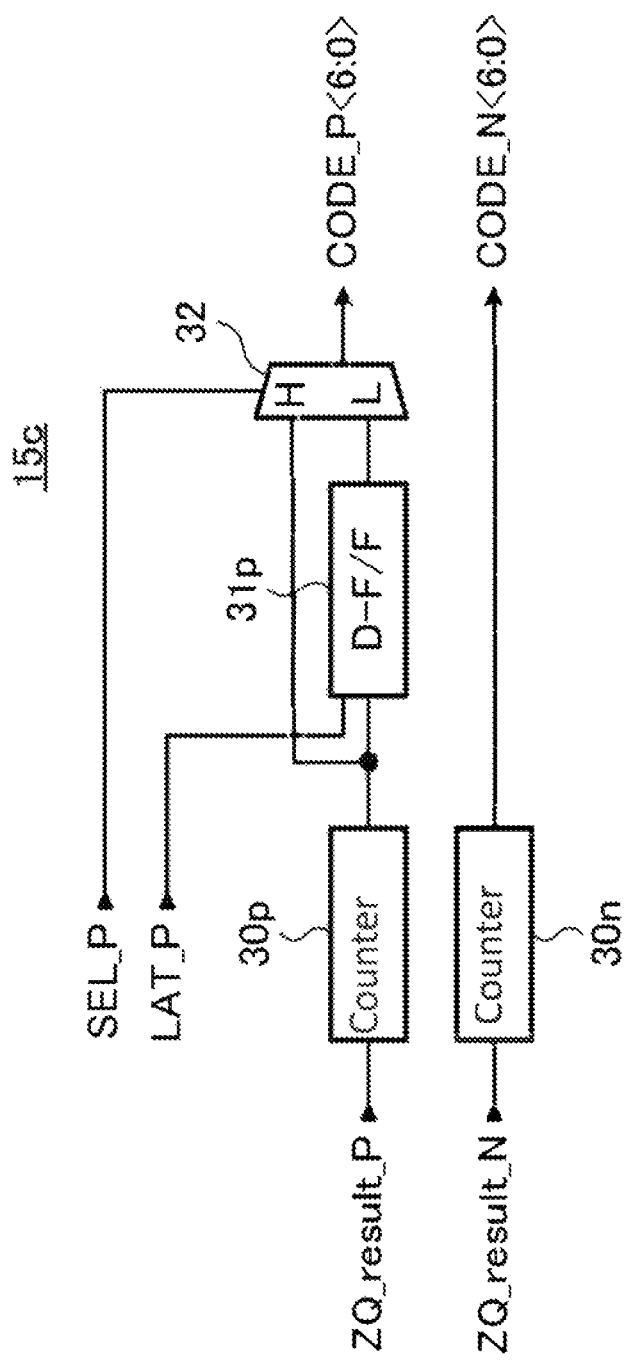
FIG. 11 is a drawing showing an internal configuration of the control circuit shown in FIG. 10.
Figure 12:
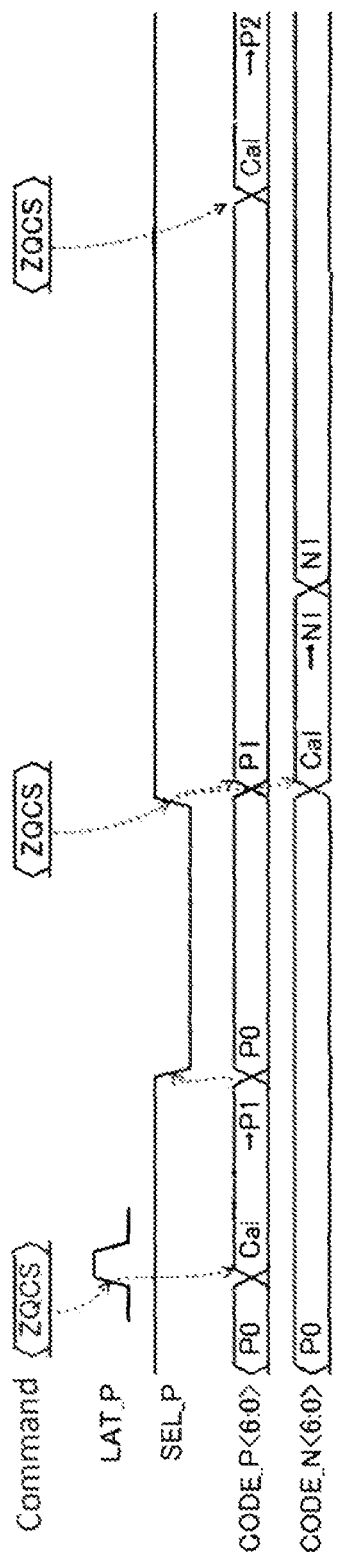
FIG. 12 is a timing chart of signals related to the semiconductor device shown in FIG. 10.

FIG. 10 shows a configuration of a semiconductor device 10c according to a preferred third embodiment of the present invention. With reference to FIG. 10 to FIG. 12, the semiconductor device 10c according to the third embodiment of the present invention will be explained. The semiconductor device 10c is different is different from the semiconductor device 10b according to the second embodiment in a point that the code signals CODE_P_REP <6:0> are integrated with the control signals CODE_P <6:0> and that the control signals CODE_N_REP <6:0> are integrated with the control signals CODE_N <6:0> and a point that the internal configuration of the control circuit 15c is changed along with that. Since other points thereof are similar to the semiconductor device 10b, similar components are denoted with the same reference signs, explanations thereof are omitted, and different points will be focused on and explained below.

As shown in FIG. 10, instead of the control signals CODE_P_REP <6:0>, the control signals CODE_P <6:0> are supplied to the Pch replica circuits 15r1 and 15r2 according to the present embodiment. Therefore, the transistors in the Pch replica circuits 15r1 and 15r2 are commonly controlled with the transistors of the pull-up circuit 13p by the control signals CODE_P <6:0>. Instead of the control signals CODE_N_REP <6:0>, the control signals CODE_N <6:0> are supplied to the Nch replica circuit 15r3 according to the present embodiment. Therefore, the transistors of the Nch replica circuit 15r3 are commonly controlled with the transistors of the pull-down circuit 13n by the control signals CODE_N <6:0>.

FIG. 11 shows an internal configuration of the control circuit 15c shown in FIG. 10. As shown in FIG. 11, the control circuit 15c has the counters 30p and 30n, the D-type circuit 31p, and a multiplexer 32. Operation of the counters 30p and 30n is similar to that explained in the first embodiment. However, the output signals are the control signals CODE_P <6:0> and CODE_N <6:0> instead of the control signals CODE_P_REP <6:0> and CODE_N_REP <6:0>.

The D-type flip-flop circuit 31p latches the output signal of the counter 30p at the activation timing of a latch signal LAT_P, which is activated by an unshown control circuit. Operation of the D-type flip-flop circuit 31p as a single circuit is similar to that explained in the first embodiment, but the role thereof is different. More specifically, in the first embodiment, the role is to temporarily store the control signals CODE_P_REP <6:0> generated by the counter 30p until generation of the control signals CODE_N_REP <6:0> is completed. On the other hand, in the present embodiment, the role is to store the control signals CODE_P <6:0> immediately before generation while generation of the control signals CODE_P <6:0> is carried out by the counter 30p. Details will be described later In accordance with a selection signal SEL_P, which is activated by an unshown control circuit, the multiplexer 32 selects either one of the output signal of the counter 30p and the output signal of the D-type flip-flop circuit 31p (the signal latched by the D-type flip-flop circuit 31p) and outputs that as the control signal CODE_P <6:0>.

FIG. 12 shows a timing chart showing operation of the control circuit 15c. In FIG. 12, as with the example shown in FIG. 6, first as an initial state, the contents of the control signals CODE_P <6:0> and CODE_N <6:0> are assumed to be "P0" and "N0", respectively. The selection signal SEL_P is assumed to be at a high level, thereby achieving a state in which the multiplexer 32 is selecting the output signal of the counter 30p.

When the calibration command ZQCS is supplied, the latch signal LAT_P is activated by the unshown control circuit. In response to this, the output signal (the signal representing "P0") of the counter 30p at this point is latched by the D-type flip-flop circuit 31p. Subsequently, the control circuit 15c activates the counter 30p. Since the processing of the counter 30p in response to this is similar to that explained in the fast embodiment, detailed explanation thereof will be omitted.

After the contents of the output signal of the control circuit 15c end, the control circuit 15c deactivates the counter 30p again. Thereafter, the contents of the output signal of the counter 30p are fixed to "P1" as shown in FIG. 12. In response to end of the contents of the output signal of the control circuit 15c, the unshown control circuit changes the selection signal SEL_P to a low level. As a result, the multiplexer 32 selects the output signal of the D-type flip-flop circuit 31p, and the contents of the control signals CODE_P <6:0>, which have been temporarily "P1", return to "P0". According to this operation, although the control signals CODE_P <6:0> are switched between "P0" and "P1" in a short period of time, there is no particular problem since a read command or an ODT command is not input during the calibration operation.

As in the case of the fast embodiment, after sufficient time has elapsed for ending the contents of the control signals CODE_P <6:0>, the external controller supplies the calibration command ZQCS again to the semiconductor device 10a. The unshown control circuit, which has received it, returns the selection signal SEL_P to a high level. As a result, the multiplexer 32 selects the output signal of the control circuit 15c, and the contents of the control signals CODE_P <6:0> become "P1". Moreover, the control circuit 15c activates the counter 30n. Since the processing of the counter 30n in response to this is similar to that explained in the first embodiment, detailed explanations thereof will be omitted.

The contents of the control signals CODE_N <6:0> finally end at "N1" by the processing of the counter 30n. At this point, the contents of the control signals CODE_P <6:0> have already become "P1", therefore, the series of calibration operations is finished here.

As explained above, according to the semiconductor device 10c according to the present embodiment, the control signals CODE_P_REP <6:0> can be integrated with the control signals CODE_P <6:0>, and the control signals CODE_N_REP <6:0> can be integrated with the control signals CODE_N <6:0>. Therefore, since the total extension of the wiring laid between the control circuit 15c, the output buffer 11, the replica output circuit 15r, and the Pch replica circuit 15r1 can be shortened, the area of the wiring region can be reduced. Moreover, restrictions on the installation location of the control circuit 15c are reduced, and the control circuit 15c can be efficiently disposed by using an available region.

Figure 13:
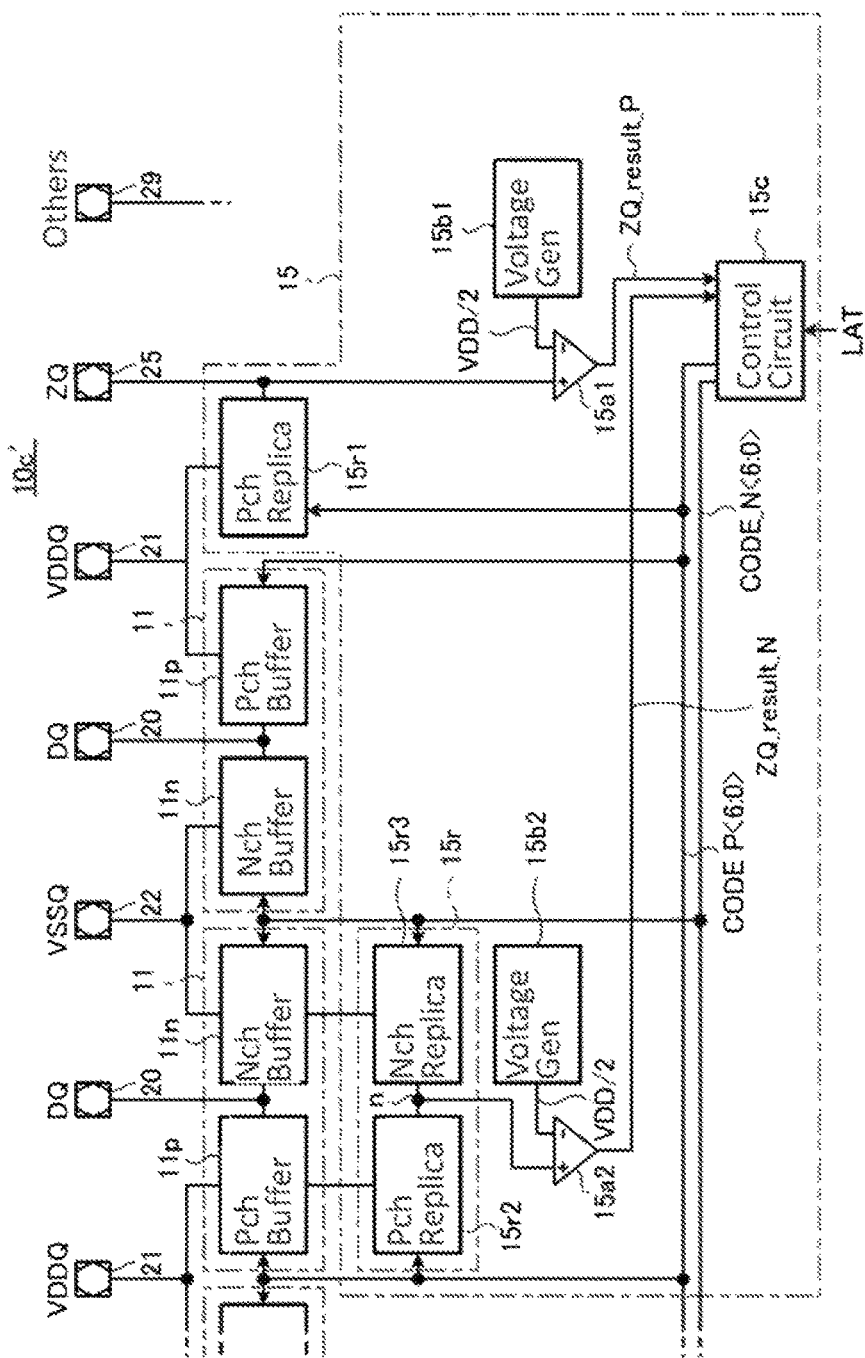
FIG. 13 is a block diagram showing a configuration of a semiconductor device according to a modification example of the preferred third embodiment of the present invention.

FIG. 13 shows a configuration of the semiconductor device 10c' according to a modification example of the third embodiment of the present invention. In the example of FIG. 10, the replica output circuit 15r is disposed in the vicinity of the data input/output terminal 20, which is the closest to the calibration terminal 25, and receives supply of the power source potential VDDQ and the ground potential VDD via the power source terminal 21 and the power source terminal 22, which are disposal adjacent to the data input/output terminal 20. However, it is not essential to employ such a configuration. For example, like the semiconductor device 10c' shown in FIG. 13, the replica output circuit 15r may be disposed in the vicinity of the data input/output terminal 20, which is not the data input/output terminal 20 that is the closest to the calibration terminal 25, and the power source potential VDDQ and the ground potential VDDQ may be supplied to the replica output circuit 15r via the power source terminal 21 and the power source terminal 22, which are disposed adjacent to the data input/output terminal 20. Even in this case, as with the semiconductor device 10c shown in FIG. 10, the area of the wiring region can be reduced, and the control circuit 15c can be efficiently disposed by using an available region.

<Fourth Embodiment>

Figure 14:
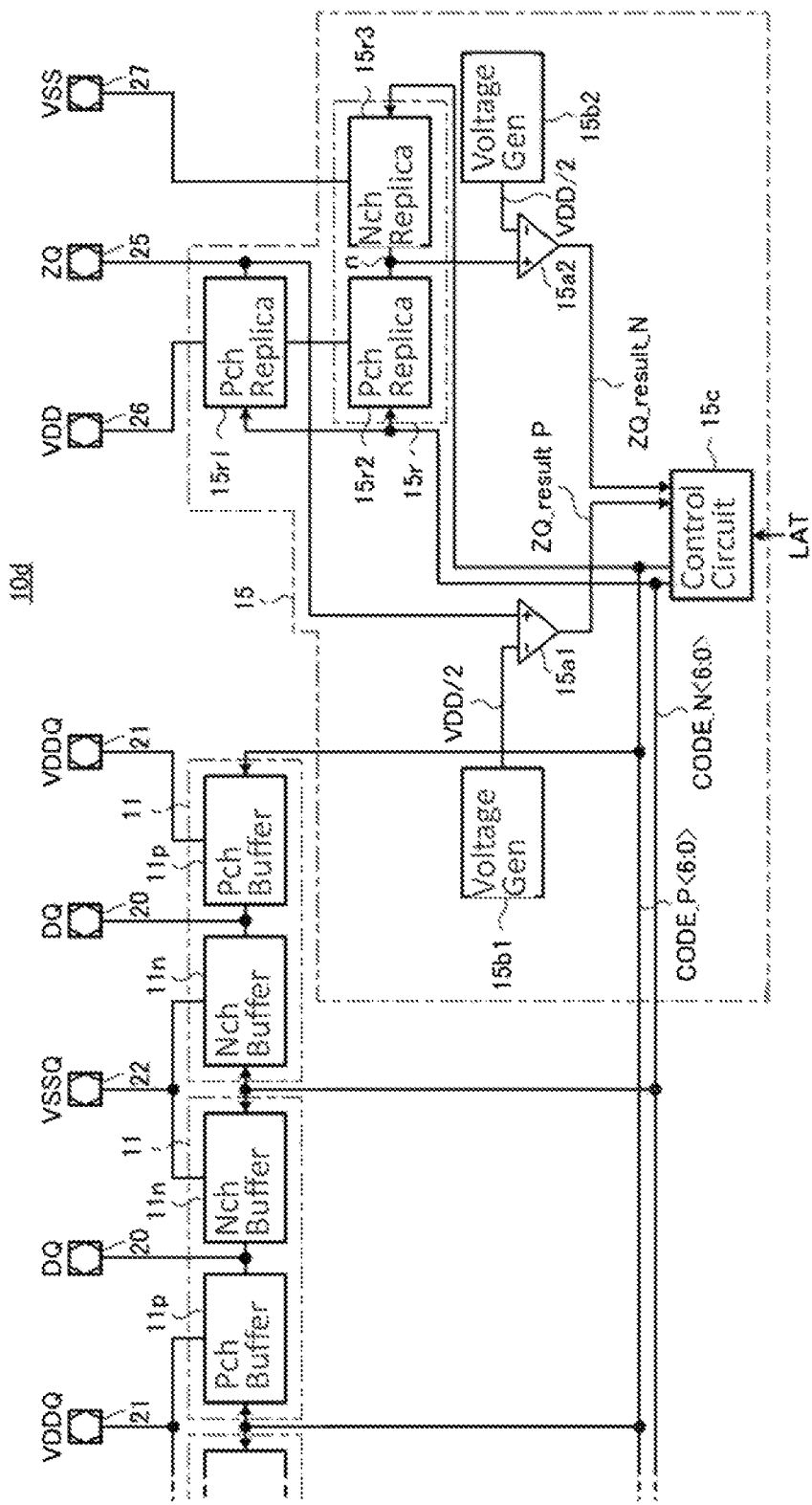
FIG. 14 is a block diagram showing a configuration of a semiconductor device according to a fourth preferred embodiment of the present invention.

FIG. 14 shows a semiconductor device 10d according to a fourth embodiment of the present invention. According to the semiconductor device 10d, as with the semiconductor device 10a shown in FIG. 1, the calibration terminal 25 is disposed at a position distant from the data input/output terminal 20. Furthermore, the power source terminal 26 and the power source terminal 27 are disposed on both sides of the calibration temiinal 25. The Pch replica circuit 15r1 is connected to the power source terminal 26, and the replica output circuit 15r is connected to the power source terminal 26 and the power source terminal 27. Furthermore, as with the semiconductor device 10c shown in FIG. 10, the control signals CODE_P_REP <6:0> are integrated with the control signals CODE_P <6:0>, and the control signals CODE_N_REP <6:0> are integrated with the control signals CODE_N <6:0>. The internal configuration of the control circuit 15c is similar to that shown in FIG. 11. The impedance of the P-type buffer 11p, the P-type replica 15r1, and the P-type replica 15r2 is commonly controlled based on the common control signals CODE_P <6:0>. The impedance of the N-type replica 15r3 and the N-type buffer 11n is commonly controlled based on the common control signals CODE_N <6:0>.

According to the semiconductor device 10d according to the present embodiment, based on the common control signals supplied from the control circuit, the replica circuits and the output buffer 11 are controlled, and controllability is improved. As with the semiconductor device 10c shown in FIG. 10, the area of the wiring region can be reduced, and the control circuit 15c can be efficiently disposed by using an available region.

<Fifth Embodiment>

Figure 15:
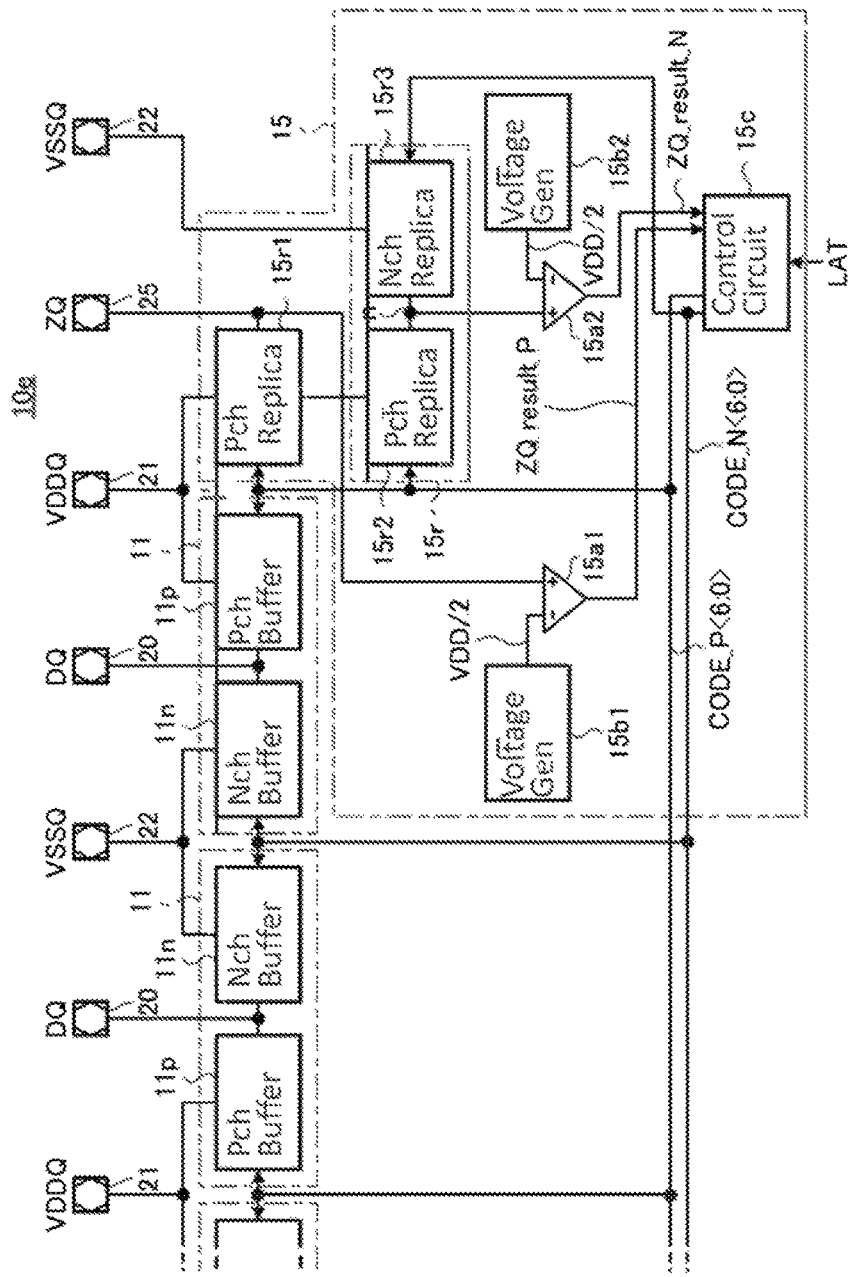
FIG. 15 is a block diagram showing a configuration of a semiconductor device according to a preferred fifth embodiment.

FIG. 15 Shows a semiconductor device 10e according to a fifth embodiment of the present invention. According to the semiconductor device 10d, as with the semiconductor device 10b shown in FIG. 7, the calibration terminal 25 is disposed adjacent to the power source terminal 21, which is disposed adjacent to the data input/output terminal 20. The Pch replica circuit 15r1 is connected to the power source terminal 21. Furthermore, the power source terminal 22 is disposed adjacent to the calibration terminal 25. The replica output circuit 15r is connected to the power source terminal 22 and the above described power source terminal 21. As with the semiconductor device 10c shown in FIG. 10, the control signals CODE_P_REP <6:0> are integrated with the control signals CODE_P <6:0>, and the control signals CODE_N_REP <6:0> are integrated with the control signals CODE_N <6:0 >. The internal configuration of the, control circuit 15c is similar to that shown in FIG. 11.

With the semiconductor device 10e according to the present embodiment, while the effect of improving the degree of freedom in pad layout while avoiding reduction in the calibration performance cannot be obtained, as with the semiconductor device 10c shown in FIG. 10, the area of the wiring region can be reduced, and the control circuit 15c can be efficiently disposed by using an available region.

Hereinabove, the preferred embodiment of the present invention have been explained. However, the present invention is not limited to the above described embodiments, various modifications can be made within the range not departing from the gist of the present invention, and it goes without saying that they are also included in the range of the present invention.

For example, in the above described embodiments, the examples in which the present invention is applied to the output buffer 11 of read data; however, the present invention can be widely applied to an access circuit that is configured to access a certain terminal, is configured to receive supply of potentials from two terminals disposed in both sides of the terminal and operate, and serves as a target of calibration.

What is claimed is:

1. An apparatus comprising:
a first power source terminal supplied with a first power potential;
a second power source terminal supplied with a second power potential;
a data terminal, wherein the data terminal is diposed between the first and second power source terminals;
a calibration terminal, wherein the calibration terminal is disposed such that the second power source terminal is between the data terminal andthe calibration terminal;
a third power source terminal supplied with a third power potential, wherein the third power source terminal is disposed between the second power source terminal and the calibration terminal;
an output buffer, wherein the output buffer comprises a first circuit and a second circuit, wherein the first circuit is coupled between the first power source terminal and the data terminal to drive the data terminal toward the first power potential, and wherein the second circuit is coupled between the data terminal and the second power source terminal to drive the data terminal to the second power potential; and
a calibration circuit, when the calibration circuit is configured to perform a calibration operation on the output buffer, wherein the calibration circuit comprises a third circuit serving as a replica of the first circuit, a fourth circuit serving as a replica of the second circuit and a fifth circuit serving as a replica of the second circuit, and wherein the fourth circuit is coupled between the third power source terminal and the calibration terminal.

2. The apparatus of claim 1, wherein the third circuit is coupled between the first power source terminal and a node; and
wherein the fifth circuit is coupled between the second power source terminal and the node.

3. The apparatus of claim 2, wherein the first power source terminal, the data terminal, the second power source terminal, the third power source terminal and the calibration terminal are arranged in line in a first direction.

4. The apparatus of claim 2, wherein the second power potential is substantially equal to the third power potential; and
wherein the first power potential is different from each of the second and third power potential.

5. The apparatus of claim 4, wherein the calibration circuit further comprises:
a first comparator configured to compare a voltage level at the calibration terminal with a first reference voltage level; and
a second comparator configured to compare a voltage level at the node with a second reference voltage level.

6. The apparatus of claim 5, wherein the calibration circuit further comprises a control circuit configured to provide the first and second circuits with calibration code information based, at least in part, on outputs of the first and second comparators.

7. The apparatus of claim 2, wherein the first power source terminal, the data terminal, the second power source terminal, the third power source terminal and the calibration terminal are arranged in line in a first direction to form a first arrangement;
wherein the first circuit, the second circuit and the fourth circuit are arranged in line in the first direction to form a second arrangement;
wherein the third circuit and the fifth circuit are arranged in line in the first direction to form a third arrangement; and
wherein the second arrangement is between the first and third arrangements.

8. The apparatus of claim 7, wherein the first circuit and the third circuit are arranged in line in a second direction crossing the first direction; and
wherein the second circuit and the fifth circuit are arranged in line in the second direction.

9. The apparatus of claim 7, wherein the calibration circuit further comprises:
a first comparator configured to compare a voltage level at the calibration terminal with a first reference voltage level; and
a second comparator configured to compare a voltage level at the node with a second reference voltage level;
wherein the first comparator and the second comparator are arranged in line to form a fourth arrangement; and
wherein the third arrangement is between the second and fourth arrangements.

10. The apparatus of claim 9, wherein the calibration circuit further comprises a control circuit configured to provide the first and second circuits with calibration code information based, at least in part, on outputs of the first and second comparators.

11. The apparatus of claim 1, further comprising a fourth power source terminal supplied with a fourth power potential;
wherein the fourth power source terminal is arranged such that the calibration terminal is between the third power source terminal and the fourth power source terminal;
wherein the third circuit is coupled between the fourth power source terminal and a node; and
wherein the fifth circuit is coupled between the third power source terminal and the node.

12. The apparatus of claim 11, wherein the first power source terminal, the data terminal, the second power source terminal, the third power source terminal, the calibration terminal and the fourth power source terminal are arranged in line in a first direction.

13. The apparatus of claim 11, wherein the first power potential is substantially equal to the fourth power potential and different from each of the second and third power potential, and
wherein the second power potential is substantially equal to the third power potential.

14. The apparatus of claim 13, wherein the calibration circuit further comprises
a first comparator configured to compare a voltage level at the calibration terminal with a first reference voltage level; and
a second comparator configured to compare a voltage level at the node with a second reference voltage level.

15. The apparatus of claim 14, wherein the calibration circuit further comprises a control circuit configured to provide the first and second circuits with calibration code information based, at least in part, on outputs of the first and second comparators.

16. The apparatus of claim 11, wherein the first power source terminal, the data terminal, the second power source terminal, the third power source terminal, the calibration terminal and the fourth power source terminal are arranged in line in a first direction to form a first arrangement;
wherein the first circuit, the second circuit and the fourth circuit are arranged in line in the first direction to form a second arrangement;
wherein the third circuit and the fifth circuit are arranged in line in the first direction to form a third arrangement; and
wherein the second arrangement is between the first and third arrangements.

17. The apparatus of claim 16, wherein the fourth circuit and the fifth circuit are arranged in line in a second direction to form a fourth arrangement, the second direction crossing the first direction.

18. The apparatus of claim 17, wherein the third circuit si arranged on an opposite side to the second circuit with respect to the fourth arrangement.

19. The apparatus of claim 16, wherein the calibration circuit further compprises:
a first coomparator configured to compare a voltage level at the calibration terminal with a first reference voltage level; and
a second comparator configured to compare a voltage level at the node with a second reference voltage level;
wherein the first comparator and the second comparator are arranged in line to form a fourth arrangement; and
wherein the third arrangement is between the second and fourth arrangements.

20. The apparatus of claim 16, wherein the calibration circuit further comprises a control circuit configured to provide the first and second circuits with calibration code information based, at least in part, on outputs of the first and second comparators.

* * * * *